United States Patent
Diduck et al.

(10) Patent No.: US 9,882,007 B2
(45) Date of Patent: Jan. 30, 2018

(54) HANDLE FOR SEMICONDUCTOR-ON-DIAMOND WAFERS AND METHOD OF MANUFACTURE

(71) Applicant: RFHIC Corporation, Anyang-si (KR)

(72) Inventors: Quentin Diduck, Santa Clara, CA (US); Daniel Francis, Santa Clara, CA (US); Frank Yantis Lowe, Santa Clara, CA (US); Felix Ejeckham, Santa Clara, CA (US)

(73) Assignee: RFHIC Corporation, Anyang-si (KR)

(*) Notice: Subject to any disclaimer, the term of this patent is extended or adjusted under 35 U.S.C. 154(b) by 107 days.

(21) Appl. No.: 14/409,867

(22) PCT Filed: Jul. 2, 2013

(86) PCT No.: PCT/IB2013/055417
§ 371 (c)(1),
(2) Date: Dec. 19, 2014

(87) PCT Pub. No.: WO2014/006562
PCT Pub. Date: Jan. 9, 2014

(65) Prior Publication Data
US 2015/0200254 A1 Jul. 16, 2015

Related U.S. Application Data

(60) Provisional application No. 61/667,864, filed on Jul. 3, 2012.

(51) Int. Cl.
*H01L 23/00* (2006.01)
*H01L 29/16* (2006.01)
(Continued)

(52) U.S. Cl.
CPC .... *H01L 29/1602* (2013.01); *H01L 21/02002* (2013.01); *H01L 21/2007* (2013.01);
(Continued)

(58) Field of Classification Search
CPC ..... H01L 29/1602; H01L 24/98; H01L 24/29; H01L 29/165; H01L 21/02002;
(Continued)

(56) References Cited

U.S. PATENT DOCUMENTS 4,256,535 A * 3/1981 Banks ............... C30B 33/00
438/691
5,227,339 A * 7/1993 Kishii ............... B28D 5/00
216/52

(Continued)

FOREIGN PATENT DOCUMENTS

JP H06-244073 9/1994
JP 2003-289120 10/2003
(Continued)

OTHER PUBLICATIONS

Balmer et al. "Chemical vapour deposition synthetic diamond: materials, technology and applications," Journal of Physics: Condensed Matter, vol. 21, No. 36, Aug. 19, 2009.*
(Continued)

*Primary Examiner* — Aaron Austin
*Assistant Examiner* — Michael Zhang
(74) *Attorney, Agent, or Firm* — Patent Office of Chung Park

(57) ABSTRACT

Methods for mounting and dismounting thin and/or bowed semiconductor-on-diamond wafers (401) to a carrier (407) are disclosed that flatten said wafers and provide mechanical support to enable efficient semiconductor device processing on said semiconductor-on-diamond wafers.

16 Claims, 8 Drawing Sheets

(51) Int. Cl.
*H01L 21/683* (2006.01)
*H01L 29/165* (2006.01)
*H01L 23/373* (2006.01)
*H01L 21/20* (2006.01)
*H01L 21/02* (2006.01)

(52) U.S. Cl.
CPC ...... *H01L 21/6835* (2013.01); *H01L 23/3732* (2013.01); *H01L 24/29* (2013.01); *H01L 24/98* (2013.01); *H01L 29/165* (2013.01); *H01L 2221/6835* (2013.01); *H01L 2221/68318* (2013.01); *H01L 2221/68381* (2013.01); *H01L 2924/0002* (2013.01); *Y10T 428/24355* (2015.01)

(58) Field of Classification Search
CPC ............. H01L 21/2007; H01L 21/6835; H01L 23/3732; H01L 2924/0002; H01L 2221/68381; H01L 2221/6835; H01L 2221/68318; Y10T 428/24355
See application file for complete search history.

(56) References Cited

U.S. PATENT DOCUMENTS

| | | | |
|---|---|---|---|
| 5,387,555 A | 2/1995 | Linn et al. | |
| 5,476,566 A * | 12/1995 | Cavasin | H01L 21/6835 156/154 |
| 5,679,152 A * | 10/1997 | Tischler | B82Y 15/00 117/1 |
| 6,028,772 A * | 2/2000 | Suhir | H01L 23/3735 165/80.2 |
| 7,595,507 B2 | 9/2009 | Francis et al. | |
| 2002/0048907 A1* | 4/2002 | Miyamoto | G06K 19/077 438/464 |
| 2003/0111174 A1* | 6/2003 | Suzuki | C08G 59/188 156/330 |
| 2004/0256624 A1* | 12/2004 | Sung | H01L 21/0237 257/77 |
| 2005/0145879 A1* | 7/2005 | Nakayama | B24B 37/08 257/103 |
| 2006/0113545 A1* | 6/2006 | Weber | H01L 21/02381 257/77 |
| 2006/0226412 A1* | 10/2006 | Saxler | H01L 21/0237 257/11 |
| 2008/0014763 A1* | 1/2008 | Lu | H01L 21/2686 438/795 |
| 2008/0090380 A1* | 4/2008 | Gardner | C09J 5/06 438/455 |
| 2008/0176366 A1* | 7/2008 | Mita | H01L 29/2003 438/172 |
| 2011/0065238 A1* | 3/2011 | Chiou | H01L 21/561 438/107 |
| 2011/0186959 A1 | 8/2011 | Jerome et al. | |

FOREIGN PATENT DOCUMENTS

| | | |
|---|---|---|
| JP | 2007-500439 | 1/2007 |
| JP | 2010-147184 | 1/2010 |

OTHER PUBLICATIONS

Faili et al. "Development of III-Nitride HEMTs on CVD Diamond Subtrates," CS Mantech Conference, May 16-19, 2011.*

AI Technology, "Basic Principles of Adhesive Bonding" Feb. 1, 2008, https://web.archive.org/web/20080201080541/http://www.aitechnology.com/faq/adhesivebondingprinciple/.*

Lee et al. "Wafer-to-Wafer Alignment for Three-Dimensional Integration: A Review" Journal of Microelectrochemical systems, vol. 20, No. 3, Aug. 2011.*

Smith et al. "Cleaning of GaN Surfaces" Journal of Electronic Materials, vol. 25, Nol. 5, 1996.*

Francis, D., et al. "Formation and characterization of 4-inch GaN-on-diamond substrates." Diamond and Related Materials 19.2 (2010): 229-233.*

Babić, D. I., et al. "GaN-on-diamond field-effect transistors: from wafers to amplifier modules." MIPRO, 2010 Proceedings of the 33rd International Convention. IEEE, 2010.*

International Search Report for PCT/IB2013/055417 dated Sep. 25, 2013.

* cited by examiner

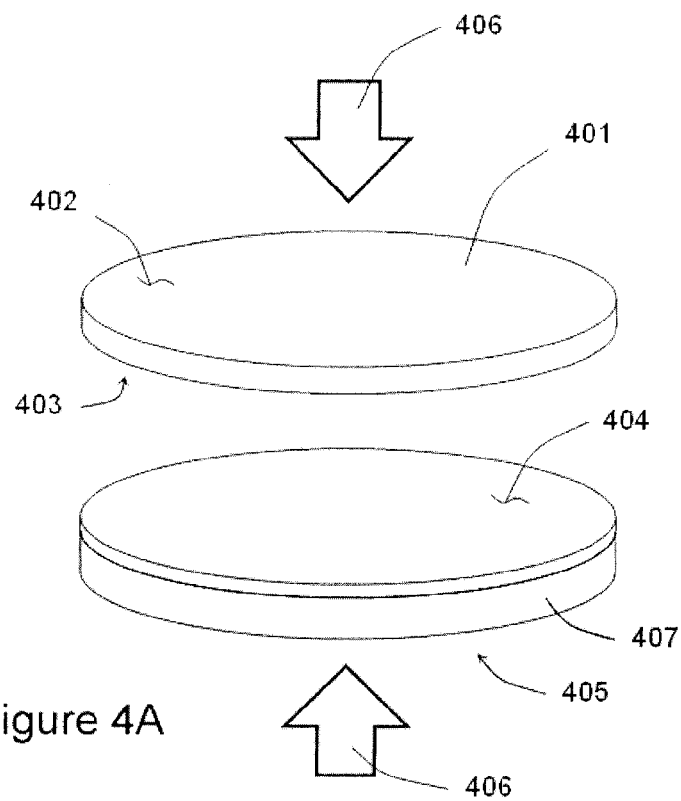
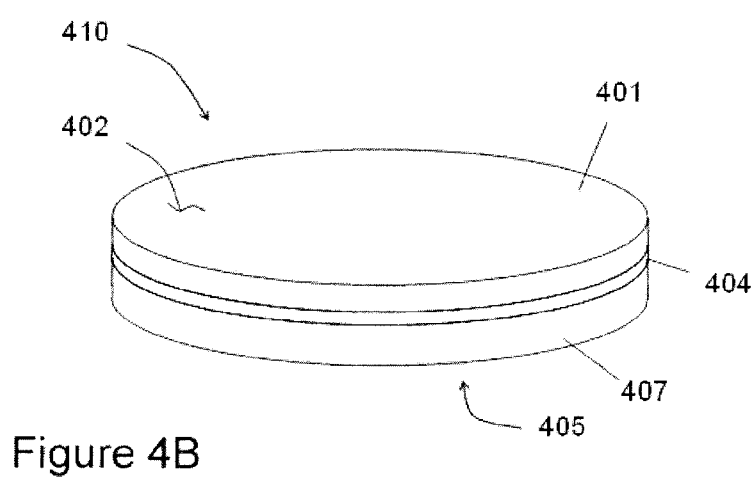
Figure 4A
Figure 4B

HANDLE FOR SEMICONDUCTOR-ON-DIAMOND WAFERS AND METHOD OF MANUFACTURE

FIELD OF THE INVENTION

The present invention relates to manufacturing of high-power electronic and optoelectronic devices on diamond wafers, and particularly relates to methods for providing a handle wafer as support for thin semiconductor-on-diamond wafers (<200 µm thick) so they can be efficiently handled in standard semiconductor-device manufacturing lines, and more particularly with gallium nitride on diamond wafers that are typically 100 µm thick to be processed in a standard semiconductor manufacturing line into high-electron mobility transistors, radio-frequency (RF) electronic devices, light-emitting-diodes, and lasers.

BACKGROUND OF THE INVENTION

Thermal management in semiconductor devices and circuits is a critical design element in any manufacturable and cost-effective electronic and optoelectronic product, such as light generation and electrical signal amplification. The goal of efficient thermal design is to lower the operating temperature of such electronic or optoelectronic devices while maximizing performance (power and speed) and reliability. Examples of such devices are microwave transistors, light-emitting diodes and lasers. Gallium nitride (GaN), aluminum nitride (AlN) and other wide-gap semiconductors are commonly used in both power electronics and visible-light generating optoelectronics. Gallium nitride material systems give rise to microwave transistors with high-electron mobility and high breakdown voltage suitable for use in high power applications. GaN is also used in manufacturing of blue and ultraviolet lasers and light-emitting diodes. In spite of the high-temperature performance, GaN and related ternary compounds exhibit relatively low thermal conductivity of the substrates commonly used for growth of GaN. This deficiency is most pronounced in high-power microwave and millimeter-wave transistors and amplifiers where reduced cooling requirements and longer device life, both benefiting from lower junction temperature, are in critical demand. One of the most efficient and advanced technologies for thermal management high-power devices relies on placing the active layers of GaAs, InP, Si, or GaN on top of a highly thermally conductive heatsink and ensuring that the distance between the active epilayers and the heatsink is minimized. Shortening the distance heat has to flow from the heat source to the highly thermally conductive heat spreaders and heatsink lowers the overall thermal resistance. Diamond is the most thermally conductive substance known to man and the semiconductor industry has been employing diamond heat-sinks and heat spreaders for improved thermal management since the commercialization of synthetic diamond by chemical-vapor deposition in the 1980-ies. There is more than one way of placing active epilayers on top of diamond heatsinks and heat-spreaders. In particular, epilayer transfer or atomic attachment technologies in which several micrometer epilayers are transferred onto diamond wafers are most promising methods for thermal management of power devices. In addition, there are other reasons for transferring epilayers to diamond. For example, diamond hardness and high breakdown field are other reasons one combines a semiconductor and diamond in one device. The final result of such an integration is a semiconductor-on-diamond wafer and ultimately a chip.

Diamond wafers are manufactured by chemical vapor deposition (CVD) by one of three methods: plasma enhanced diamond CVD where the energy to dissociate the reactants comes from a microwave sources, hot-filament enhanced diamond CVD where the energy for dissociating gasses comes from a hot tungsten filament, and high voltage torch where ions are accelerated using a high DC voltage. Using these technologies, diamond wafers of standard diameters and thicknesses can be created. There is however one essential difference between working with diamond substrates and other common semiconductor substrates, such as, GaAs, InP, and Silicon: diamond is hard to thin and polish (diamond grit is commonly used for thinning of other semiconductors), but most importantly, diamond wafer price increases with its thickness and hence it is difficult to justify using a diamond substrate thicker than is necessary both for thermal management purposes or chip handling purposes. The most significant consequence of this fact is that diamond wafers are not thinned during backside processing as for standard semiconductor wafers. Therefore, the thickness of the wafer at the start of the process is necessarily equal, or approximately equal, to the desired final chip thickness. For example, device processing on silicon, gallium arsenide, gallium nitride wafers occurs while these substrates are over 500 µm thick. Such thickness provides sufficient mechanical rigidity and low bow that commercial foundries can handle such wafers. At the end of the device processing, the wafers are thinned down to the desired chip thickness. The chip thickness, on the other hand, is determined by several constraints: optimal heat-spreading from the active device to the heatsink below the chip and ease of dicing are just two of the most important constraints. Since thinning down diamond wafers makes little economic sense, semiconductor-on-diamond wafers tend to be of the same thickness as the final chips, which is generally thinner than typical commercially available silicon or compound-semiconductor wafers. Since chip thicknesses and hence semiconductor-on-diamond wafers may range from tens of micrometers to several hundred micrometers, they are too thin for commercial foundry processing. First, handling such thin wafers with diameters larger 25 mm is exceedingly difficult and not practical in neither manual nor robotic/automated processing. Second, CVD-grown diamond wafers include internal stresses and exhibit bow that is several times larger than the common limit for wafer bow in commercial lithography tools. Industrial processing plants will generally not accept wafers with such attributes. Additionally, the diamond surface of the semiconductor-on-diamond wafer is often rough with average absolute roughness of several tens of micrometers which makes it more difficult to hold wafers down to a chuck using vacuum—a feature important in lithography processing. Similar problems appear when thru-vias are used on wafers.

There has been substantial effort in the industry to bond GaN epilayers to CVD diamond and to attach other compound materials to diamond to create highly thermally efficient electronic structures. As a result there is a need in the industry to enable the commercial processing of thin semiconductor-on-diamond wafers. This application discloses structures and methods to accomplish this goal.

SUMMARY OF THE INVENTION

This specification discloses methods to create a handle to support thin semiconductor-on-diamond wafers during semiconductor-device processing including lithography, high-temperature and chemical processing, and handling robustness. The application applies to processing wafers with any semiconductor epilayer on top of diamond wafers that are too fragile and/or too bowed to be processed free-standing in a standard semiconductor foundry and have to be supported by some means. This application discloses the means to support the thin semiconductor-on-diamond wafers and the methods to mount the semiconductor-on-diamond wafers onto the support or handle. Semiconductor-on-diamond wafers are also referred to as engineered wafers.

According to one aspect of the invention there is provided a composite wafer comprising:
  a semiconductor-on-diamond wafer comprising at least one layer of single-crystal semiconductor and at least one layer of diamond;
  a carrier plate; and
  an adhesive disposed between said semiconductor-on-diamond wafer and said carrier plate;
  wherein said at least one layer of diamond is proximal to said carrier plate.

According to another aspect of the invention there is provided a method of forming a composite wafer as defined above, the method comprising:
  providing a carrier plate having a first diameter, a first bow value, and a first thickness, said carrier plate having a top surface;
  providing a semiconductor-on-diamond wafer having a second diameter, a second bow value, and a second thickness, said semiconductor-on-diamond wafer having a semiconductor surface and a diamond surface, wherein said first bow value is lower than said second bow value and said first thickness is larger than said second thickness;
  providing an adhesive;
  uniformly coating at least one of said top surface of said carrier plate or said diamond surface of said semiconductor-on-diamond wafer with said adhesive to a third thickness;
  placing said semiconductor-on-diamond wafer and said carrier plate together so that said diamond surface of said semiconductor-on-diamond wafer is adjacent to said top surface of said carrier plate, with said adhesive being disposed between the diamond surface of said semiconductor-on-diamond wafer and the top surface of the carrier plate;
  exerting axial pressure to join said semiconductor-on-diamond wafer with said carrier plate; and
  curing said adhesive while controlling temperature, curing time, and axial pressure to form the composite wafer.

According to yet another aspect of the invention there is provided a method for processing semiconductor-on-diamond wafers comprising:
  mounting a semiconductor-on-diamond wafer to a carrier plate to form a composite wafer as defined above;
  fabricating semiconductor devices on a surface of said semiconductor-on-diamond wafer;
  dismounting said semiconductor-on-diamond wafer from said carrier plate; and
  using said carrier plate to mount another semiconductor-on-diamond wafer thereto for semiconductor device fabrication thereon.

The at least one layer of single-crystal semiconductor may comprise at least one semiconductor selected from the group containing gallium nitride, aluminum nitride, and indium nitride The carrier plate preferably has a low coefficient of linear thermal expansion so as to match the thermal characteristics of the semiconductor-on-diamond wafer. For example, the carrier plate may comprise a material having a coefficient of linear thermal expansion a at 20° C. in at least one plane of no more than: $10.0 \times 10^{-6}$ $K^{-1}$; $8.0 \times 10^{-6}$ $K^{-1}$; $6.0 \times 10^{-6}$ $K^{-1}$; $4.0 \times 10^{-6}$ $K^{-1}$; or $2.0 \times 10^{-6}$ $K^{-1}$. Ideally the material is a diamond material. For example, the carrier plate may be formed of a CVD diamond wafer or possible a diamond composite material such as silicon cemented diamond (ScD). It has been found that because the carrier plate and the semiconductor-on-diamond wafer need to be well matched over a wide range of physical and chemical conditions during device fabrication then a diamond carrier plate is advantageous. Furthermore, a diamond carrier plate can be re-used multiple times and is thus more commercially viable than other options.

The adhesive is advantageously porous so that the carrier plate can more readily be separated from the semiconductor-on-diamond wafer after device fabrication thereon. The adhesive should also have a low coefficient of linear thermal expansion so as to match the thermal characteristics of the semiconductor-on-diamond wafer. For example, the adhesive may comprise a material having a coefficient of linear thermal expansion a at 20° C. in at least one plane of no more than: $10.0 \times 10^{-6}$ $K^{-1}$; $8.0 \times 10^{-6}$ $K^{-1}$; $6.0 \times 10^{-6}$ $K^{-1}$; or $4.0 \times 10^{-6}$ $K^{-1}$. The adhesive material also advantageously has a melting point of at least 900° C., 1400° C., 1900° C., or 2400° C. Further still, the adhesive is advantageously capable of withstanding a temperature change of at least 900° C. in no more than 1.5 minutes while maintaining bonding between the semiconductor-on-diamond wafer and the carrier plate. Additionally, the adhesive is advantageously chemical resistant to one, more, or all of: HF; HCl; $H_2SO_4$; $HNO_3$; KOH; $H_2O_2$; Tetramethylammonium hydroxide (TMAH); Acetone; Isopropyl Alcohol (IPA); Methanol; Methylene Chloride; N-Methyl-2-pyrrolidone (NMP, 1165); Methyl Isobutyl Ketone (MIBK); and Methyl Ethyl Ketone (MEK). Examples of suitable adhesives include ceramic adhesives such as those comprising boron nitride.

The composite wafer may have a longest linear dimension of at least 50 mm, 90 mm, 120 mm, or 140 mm. One advantage of the methodology described herein is that thin, large area semiconductor-on-diamond wafers can be processed through a device fabrication line which requires flat and robust wafers on which to fabricate devices thereon. The composite wafer may comprise one or more of the following characteristics:
  an exposed surface of single-crystal semiconductor having a surface flatness of better than 30 μm, 20 μm, or 10 μm over a total area of the exposed surface of single-crystal semiconductor;
  a bow of no more than 30 μm, 20 μm, or 10 μm over a total area of the composite wafer;
  a thickness variation of no more than 30 μm, 20 μm, or 10 μm over a total area of the composite wafer;
  a tilt of no more than 30 μm, 20 μm, or 10 μm over a total area of the composite wafer;
  a semiconductor-on-diamond wafer thickness less than 200 μm; and
  a carrier plate thickness larger than 400 μm.

It has also been found to be advantageous to provide a beveled edge to the adhesive layer in order to improve device fabrication steps. Further still, it has also been found to be advantageous to provide sealant over the adhesive by sealing areas on the composite wafer where adhesive is exposed with a high-temperature sealant and curing the high-temperature sealant.

In one embodiment a thin semiconductor-on-diamond (SOD) wafer is attached to another thicker CVD diamond wafer which has sufficient rigidity to allow for processing. The thicker diamond wafer is referred to as the handle wafer or carrier wafer, namely, diamond handle (DH) wafer. The diamond handle wafer is a wafer-shaped polished diamond plate. In another embodiment, the two wafers (SOD wafer and DH wafer) are bonded using inert ceramic cement with good fired strength. In yet another embodiment, the ceramic cement is based on boron nitride (BN). In yet another embodiment, the method for bonding the two wafers comprises steps of providing a sufficient thickness of ceramic cement in between the two wafers, sealing the exposed cement edges, and gradually—in a stepwise manner—curing the cement until it is stable for high temperature processing, while the composite wafer satisfies mechanical, temperature, and chemical inertness specifications required for commercial processing. In yet another embodiment, the DH wafer is reused to mount another semiconductor-on-diamond wafer, namely, the DH wafer is recycled. In one embodiment, the composite wafer comprises of three parts: (1) semiconductor-on-diamond wafer, (2) diamond carrier wafer, and (3) ceramic cement/adhesive sandwiched between (1) and (2).

It is an objective of certain embodiments to provide a substrate for very thin semiconductor-on-diamond wafers, specifically, GaN on diamond (GaN/D) substrates produced by technology described in U.S. Pat. No. 7,595,507, and a method of attaching such wafers to a substrate. The invention shall be explained as applied to providing a support to GaN/Diamond wafers of thickness equal to approximately 100 µm with a carrier that has thickness of approximately 500 µm, but the invention can be applied to any semiconductor-on-diamond wafer of any thickness and diameter.

The advantages of attaching the thin semiconductor-on-diamond wafer to a handle wafer is that handling thicker wafers is practical both manually and robotically/automatic. Second, CVD-grown diamond wafers include internal stresses and are generally bowed several times the common limit for wafer bow in commercial lithography tools. Attaching thin and bowed semiconductor-on-diamond wafers to thicker and flat diamond handle wafers significantly reduces the bow of the SOD wafers and makes them acceptable to industrial processing plants. DH surfaces are polished and the wafers can be held down by vacuum during lithography processing. Finally, thru via holes do not have to pass through to the DH wafer and hence have no influence on holding the composite wafers down with vacuum.

BRIEF DESCRIPTION OF THE FIGURES

FIG. 4: Illustration of the semiconductor-on-diamond wafer and the diamond handle wafer A) before and B) after bonding

DETAILED DESCRIPTION OF THE INVENTION

The specifications on the mechanical rigidity, flatness, chemical inertness and processing temperature of wafers manufactured in commercial foundries depend on the type of lithography, the specific manufacturer's recipes for contact anneal and chemical processing. Hence there are both mechanical, temperature processing, and chemical inertness constrains on the SOD and DH wafers. The target specifications addressed in this application are given as follows (they do not represent a limitation on the invention is used):

Starting GaN/Diamond wafer parameters are, but are not limited to the following:
  Average GaN/Diamond wafer thickness ($W_G$): between 25 and 200 µm, typically 100 µm;
  Wafer diameter ($D_G$): any standard wafer diameter;
  Maximum height of the surface profile ($R_{tG}$): typical values are several tens of micrometers.

Starting diamond-carrier wafer parameters are, but are not limited to the following:
  Average diamond carrier-wafer thickness ($W_c$): typical values are between 500 µm and 1000 µm;
  Carrier wafer diameter ($D_c$): matched to the size of the GaN/Diamond wafer;
  Maximum height of the surface profile ($R_{tC}$): typical values are less than 10 µm.

Composite wafer specifications (non-limiting example specific to this application)

(1) Bow ($H_B$) less than 20 µm over entire wafer; this specification is based on typical stepper specifications where as wafer diameter increases the bow specification generally stays the same. The specification will vary stepper to stepper.

(2) Total thickness variation (TTV) is less than 30 µm over entire wafer.

(3) Tilt ($H_T$) less than 30 µm.

(4) Thickness of competed composite wafer 625±25 µm. Maximum thickness is denoted with $W_F$(min) and minimum $W_F$(max).

(5) Able to withstand peak process temperature (Tp) of 900° C. temperature change in less than 1.5 minutes.

(6) Chemical resistance to: HF, HCl, $H_2SO_4$, $HNO_3$, KOH, Tetramethylammonium hydroxide (TMAH), $H_2O_2$, Piranha, Nanostrip, Acetone, IPA, Methanol, Methylene Chloride, N-Methyl-2-pyrrolidone (NMP, 1165), Methyl Isobutyl ketone (MIBK), Methyl Ethyl Ketone (MEK), and other photoresist Developer solutions.

(7) Removable after device processing, which includes 900° C. temperature exposure and multiple chemical exposures.

Figure 1:
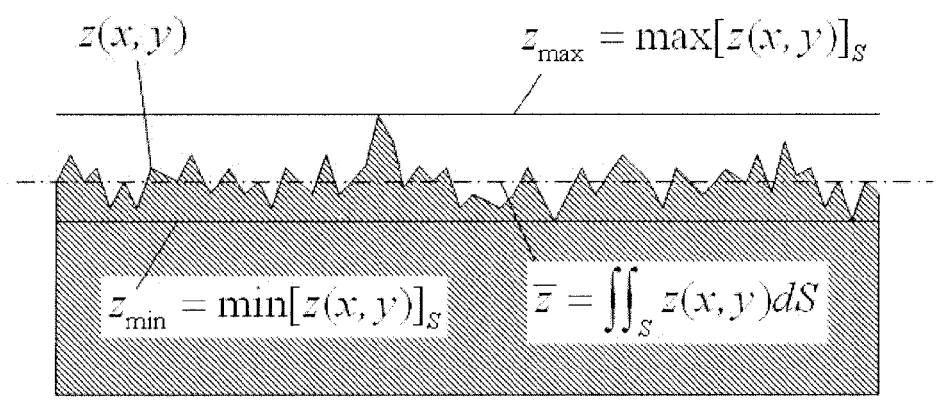
FIG. 1: Definition of surface-roughness metrics $R_a$ and $R_t$

FIG. 1 shows a schematic of a rough surface, such as one would find on a grown diamond wafer. The surface height profile is quantified with z(x,y) and the two typical surface roughness attributes are the arithmetic average of absolute values Ra and the maximum height of the profile $R_t$. Maximum height of the surface profile is defined with the help of FIG. 1 as the difference between the maximum peak and the maximum valley depth of the surface profile provided that the average of the surface profile is horizontal.

Both of these quantities can be measured as is well known in the art. The mathematical definitions are as shown in FIG. 1.

Figure 2A:
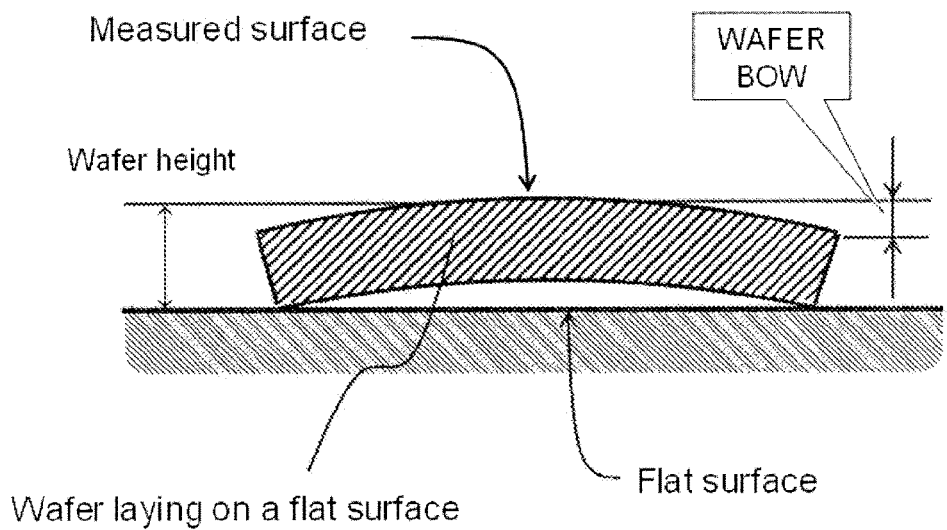
FIG. 2: Definition of mechanical attributes of wafers: A) wafer bow, B) wafer tilt, and C) total-thickness variation (TTV)
Figure 2B:
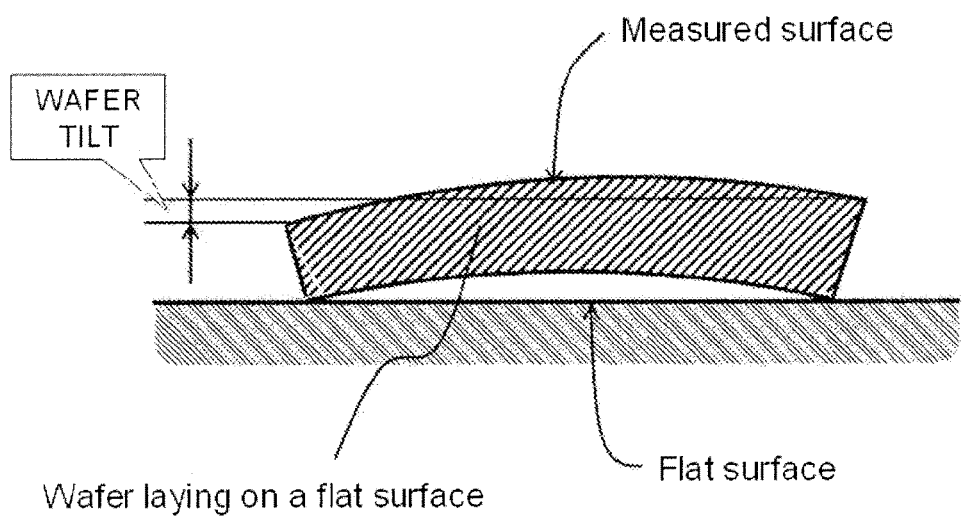
Figure 2C:
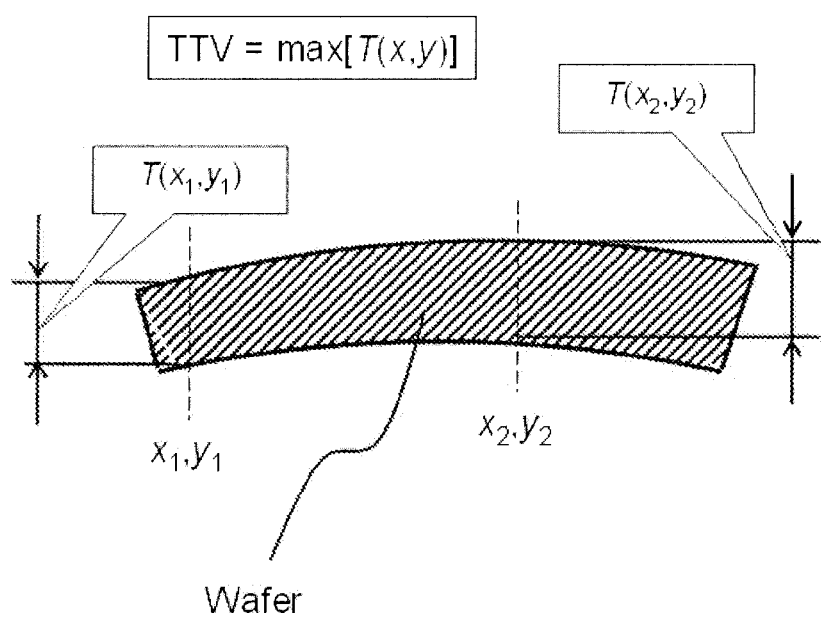

FIG. 2 illustrates the wafer physical attributes: bow, tilt, and total-thickness variation (TTV) that may be used to quantify the physical adequacy of the wafer for semiconductor-device processing. In FIG. 2A, bow of the wafer is defined as the difference between the maximum and the minimum heights of the wafer when the wafer is positioned on a flat surface. Wafer tilt, shown in FIG. 2B, is a result of the wafer having non-uniform thickness so that when it is laid flat on a flat surface one side of the wafer may be higher than the opposite side. The tilt is measured at the wafer edges and the tilt value is the difference between the highest and the lower value of the edge height. FIG. 2C illustrates the definition of total thickness variation (TTV) which is a common metric for semiconductor wafers. Any one of these metric or all may be used to determine the suitability of a wafer to be used in a semiconductor device fabrication process.

Figure 3:
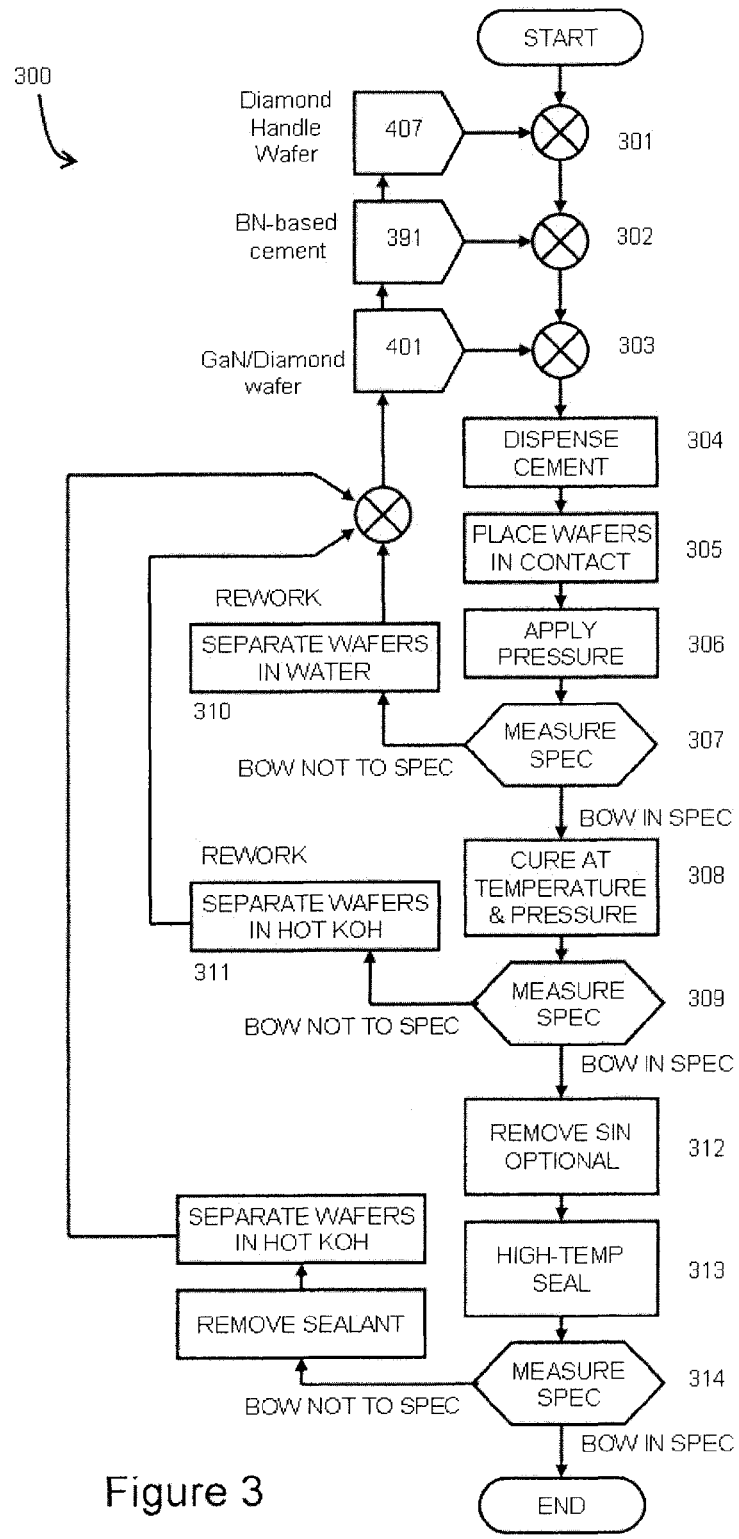
FIG. 3: Illustration of the method to mount semiconductor-on-diamond wafers onto diamond handle wafers

One embodiment of a method 300 for attaching a SOD wafer to a DH wafer is described with the help of the block diagram shown in FIG. 3. The method is described for attaching 75-mm GaN/Diamond wafers to similarly-sized DH wafer, but is applicable to any other wafer size without departing from the spirit of the invention.

The method for mounting GaN/Diamond wafers is comprises of the following steps: A DH wafer 407 is provided in Step 301. In Step 302, cement 391 is provided. This process has been developed using Aremco BN-based cement, product number 690, but similar cements can be found and used as long as they satisfy the following conditions: it does not outgas appreciably once cured, is porous or easily removable, low expansion coefficient, chemical resistant to wafer processing chemistry, mechanically robust, and able to withstand a large thermal cycle range from room temperature to in excess of the peak process temperature Tp without going through any phase change or any alteration in chemical susceptibility.

In Step 303, a GaN/Diamond wafer 401 is provided in free-standing form or mounted on a temporary carrier from which the GaN/Diamond wafer 401 can be removed using a low temperature or wet process.

The thickness $W_C$ of the DH wafer 407 may be of any commercially available thicknesses, but is chosen so that to combined thicknesses $W_{BN}+W_G+W_C$ of the DH wafer 407, the GaN/Diamond wafer 401 and the expected thickness $W_{BN}$ of the cement 391 when squished between the two falls within the required final carrier-mounted wafer thickness: $W_F(min) \leq W_{BN}+W_G+W_C \leq W_F(max)$. Average thickness of the BN cement once cured ($W_{BN}$); the thickness of the cement spread uniformly over the entire GaN/Diamond wafer and the entire DH wafer and need to planarize both wafers: $W_{BN} \sim |R_{tC} - R_{tG}|$. The typical thickness of the cement 391 is between 20 and 70 micrometers though the cement can be over 200 microns and function correctly provided the carrier is thinner.

In Step 304, the DB wafer 407 is placed on a tech-cloth and cement 391 evenly dispersed on top of the carrier wafer 407 so that it fills the roughness of the surface of the DB wafer 407 selected for bonding. A tech-cloth is a fabwipe or other clean room cleaning cloth. The cement 391 has to be sufficiently thick to completely fill and planarize the surfaces of both wafers once the cement-coated DB-wafer 407 is placed in contact with the GaN/Diamond wafer 401 in the next step. Often the wafers 407 or 401 will have 100-μm tall super-grains on the surface to be bonded and the cement has to be thick enough to planarize the surface in their presence. The quantity of cement to be deposited on the wafer 407 is to be determined beforehand based on the surface roughness and the presence of super-grains.

In Step 305, the cement-coated DB-wafer 407 is placed in contact with the GaN/Diamond wafer 401. This is illustrated in FIG. 4A where the GaN/Diamond wafer 401 with the top surface 402 and bottom surface 403 is brought into contact with the DB wafer 407 that has been coated with the cement 391 indicated with the surface 404. The bottom surface 403 of GaN/Diamond wafer 401 is the diamond surface and the top surface 402 is made out of GaN (or any other semiconductor) which may be coated with a dielectric. The wafers are placed in contact as indicated with the arrows 406. As shown in FIG. 4B, the composite wafer sandwich 410 now comprises GaN/Diamond wafer 401 and DB wafer 407 with a layer of cement 404 in between the two wafers. The cement layer 404 comprises cement 391. The composite wafer 410 is placed between two aluminum foils. When the composite-wafer 410 diameter is 75 mm, the wafer 410 is placed onto a 150 mm base wafer (base wafer larger than the composite wafer) and a ring that has an opening to fit the composite wafer 410 and an outer diameter equal to the base wafer. The stack is now covered with six more cover wafers of the same size as the base wafer. The ring is made of the same material as the base and the cover wafers. In one embodiment, the ring, base, and the cover are silicon wafers.

In Step 306, axial force approximately equal to 150 N is applied in the direction of the arrows 406 in FIG. 4A in order to make the wafers flat and parallel. Once attached and pressed, the composite wafer 410 comprises of the semiconductor-on-diamond wafer 401, the diamond handle wafer 405, and the cement layer 404 sandwiched between them. The exposed edge of the cement layer 404 may be coated with a high-temperature sealant in a later step. In one embodiment, the wafer 401 and 407 are intended to be of the same size and shape. In yet another embodiment, the 401 wafer is slightly smaller than the wafer 407.

In Step 307, the bow, tilt, and/or total thickness variation is measured on the composite wafer 410 and compared to the specification required by the process. If the specification is met one proceeds to step 308, otherwise one proceeds with rework in Step 310. In Step 310, the composite wafer 410 is immersed in water and separated into the original GaN/Diamond wafer 401 and DH wafer 407 and the process starts from step 301.

In Step 308, the composite wafer 410 is cured at elevated temperature under axial pressure of at least 25 N. The weight used to apply the pressure must be able to withstand 400° C. For this purpose, ceramic weights are preferred as they are less thermally conductive. The temperature ramp applied to the composite wafer 410 follows for a 75-mm wafer: 6 hours at 90° C., 2 hours at 130° C., 6 hours at 260° C., and 6 hours at 370° C. This ramp can be accelerated for 50-mm wafers to approximately half the time. The ramp rate for 100-mm wafer bonds is expected to be 1.5 to double the time at each step. Failure to ramp at this interval may result in cement that isn't cured in the center, or non-uniformly cured wafers. This will lead to premature failure in subsequent steps. After the cement has been cured, while the hot plate is at maximum temperature, the weight should be removed and the hotplate turned off to allow the stack to cool to below 300° C. The entire assembly (cover wafers, the composite wafer, the wafer ring, and the base wafer) should be disassembled when sufficiently cool. The foil can be removed by gently pealing it back from the wafer/carrier. It may pop off by itself, but sometimes the cement weakly bonds it to the wafer. The composite wafer 410 is left on a cooling plate until the temperature reduces to room temperature.

In Step 309, the composite wafer 410 is measured for bow, tilt, and/or TTV to check whether the wafer 410 meets specification. If the wafer fails this measurement, the composite wafer 410 has to be re-worked by proceeding with Step 311 in which hot KOH is used remove the GaN/Diamond wafer from the DH wafer and re-start the procedure. The wafer should be exposed to hot KOH for 5 or more minutes, until the wafer releases. Alternatively the wafer can be soaked in boiling water for 30 minutes and then hot KOH (this may shorten the KOH exposure requirements). Then sonication or mechanical cleaning methods can be used to remove the cement, followed by DI rinse to remove any excess KOH. The cement can be wiped off the carrier and sonication used on the wafer. This can be done in water after the cement has been broken up by the KOH. In one embodiment, the rework step 311 involves wafer separation described with method 500. If the wafer conforms to the specification proceed with Step 312.

Step 312, is optional. It should be executed if there is silicon nitride, silicon oxide, or other material deposited on top of the GaN surface that needs to be removed using hydrofluoric acid. To etch the surface material, the cemented edge (between GaN/Diamond wafer) and the DH wafer should be sealed so the wafer can be cleaned. The sealing of the cement 391 is performed using a temporary (low-temperature) sealant, such as, I-line photo resist (OCG OiR-700 10). The type and thickness of the temporary sealant is not critical except that during the application it has be sufficiently dilute that it flows readily. The sealant is applied onto the exposed cement edges and it wicks into the pores of the cement filling them. It happens that due to wicking, sealant can get smeared on top of the wafer several centimeters towards the center composite wafer 410. The photoresist on the surface can be readily removed by wiping with a tech cloth and acetone (acetone applied to the cloth and not directly on to the wafer). The sealant (in this case photoresist) is then partially cured at 90° C. for 5 minutes, and then 135° C. for 5 minutes—it should not be excessively cross-linked (occurs at higher temperatures) so that it can be later removed. Once the resist is cured, the wafer surface is cleaned from excess cement. The cleaning of the cement is done at 135° C. and using a cloth soaked into concentrated solution of KOH (saturated or near saturated solution). The KOH wiping is followed by wiping with a cloth soaked in DI water to remove the excess KOH, and then rinsed using a spray gun and dried.

The silicon nitride or other material is removed using concentrated HF (49%) for as much time as is required to remove the silicon nitride or other material. After the nitride or material has been removed, the temporary sealant is removed. If photoresist is used, the wafer should be soaked in acetone (typical time is at least 1 minute, but not more than 5 minutes, followed by IPA for 1 minute, rinse in IPA, and nitrogen gun dry).

In Step 313, the composite wafer undergoes a high temperature seal. This permanent sealant has to withstand the same temperature required on the composite wafer. In this specific application, that temperature is 900° C. The high-temperature sealant is 6% to 20% solution of hydrogen silsesquioxane (HSQ) in MIBK. These are standard products available from Dow Corning (such as the 6% and 20% solutions of XR-1541, and there are alternate lower grades that may be suitable for this application). The high-temperature sealant is applied along the cement edge as to cover the cement completely, it usually takes three applications. This step should be done under a fume hood as HSQ is toxic when uncured. The excess HSQ that accidentally appears on the front surface of the composite wafer should be removed using an acetone or other suitable solvent-soaked cloth. It is critical that all the HSQ is removed from the surface as it will turn into silicon dioxide upon cure. The composite wafer is dried at 90° C. and any excess HSQ flowing out from the wafer is removed. At this point no bubbles should be forming, and if there are any, more HSQ should be added to those places. The 90° C. bake should last 5 minutes, and then the temperature should be increased up to 130° C. and baking should last another 5 minutes. The temperature is then increased to 375° C. in 25° C. increments with soaking for 5 minutes at each temperature. At 375° C. the soak time is at least 15 minutes. After this curing, the composite wafer should be left to cool.

In Step 314, the composite wafer is characterized for bow, tilt, and/or TTV. If the final specifications are met, the method for mounting semiconductor-on-diamond wafers is complete: The composite wafer is ready for further processing. The exemplary view of the completed composite wafer 410 is given in FIG. 4B.

Various versions of the aforementioned process may be performed. One exemplary process utilizes the following method steps:
1. Secure the GaN side of the GaN/D wafer onto an optically flat surface (could be quartz, diamond or other material) using heat tape.
2. Press and flatten the upside down GaN/D onto the optically flat surface to remove any bubble at the interface of heat tape and diamond.
    a. There is an advantage in using the clear optical flat (like quartz), as one can visually check for the presence of bubbles. The disadvantage would be the difference in CTE.
        i. With quartz this step is done at about 90-100° C.
        ii. With diamond this step is done at room temperature.
3. Make a thickness map (5 or more points) of the secured GaN/D+heat tape stack.
4. Apply ceramic adhesive onto the diamond side of the GaN/D wafer (clean excess material from the optical flat).
5. Gently rake the ceramic adhesive to form ridges (ridges allow for more porosity in the adhesive and make the adhesive thinner).
6. Press the handle wafer (HW) onto the ceramic adhesive+upside down GaN/D+heat tape stack.
7. Using pressure and localized sonication the stack is flattened to a predetermined height at multiple (5 or more) locations (objective is achieve parallelism) to within the resolution of the measurement tool (~1 μm).
8. Allow the ceramic adhesive to air dry at room temperature for 4 hours.
9. Soft bake at 90° C. for 1 to 2 hours and 130° C. for 1 to 2 hours.
    a. At 200° C. the heat tape will fail and allow to free the GaN/D+ceramic adhesive+HD from the optical flat.
10. Make multiple point measurements to assure parallelism and achievement of the thickness specifications between top of the GaN and bottom of HW.
11. Bake the completed stack at 260° C. for 1 to 2 hours and 370° C. for 1 to 2 hours.
12. Final bake of the stack at 700° C. for 5 to 10 minutes in an inert atmosphere.
13. Apply a beveled layer of ceramic adhesive at the periphery of the mounted GaN/D wafer.

a. The objective of the beveled adhesive layer is to guard against debris build up and ease of flow of solutions associated with any subsequent fabrication processes.
14. Apply a glass layer (HSQ) to seal the adhesive ceramic and guard against unintended dismount due to subsequent fabrication processes.
15. Bake the HSQ coated wafer to 350° C. for 10 minutes to harden the HSQ.

Several advantageous nuances of the aforementioned process may be noted including the following:

(1) Providing a beveled edge to the ceramic adhesive layer is advantageous as it improves subsequent fabrication steps.
(2) The porous nature of ceramic adhesive is advantageous as open pores allow for solution delivery and easy dismount of the semiconductor-on-diamond wafer from the diamond handle wafer.
(3) Providing a sealant around the ceramic adhesive layer is advantageous for preventing solutions entering the porous adhesive layer during subsequent fabrication steps.

Achievable flatnesses for the top surface of the semiconductor-on-diamond wafer when bonded to a diamond handle wafer in the aforementioned manner can be better than 30 µm, 20 µm, 10 µm, 5 µm, or 1 µm.

According to one embodiment the ceramic adhesive is applied to a surface of the diamond handle wafer and then the semiconductor-on-diamond wafer is bonded thereto. According to another embodiment the ceramic adhesive is applied to the diamond side of the semiconductor-on-diamond wafer and then the diamond handle wafer is bonded thereto. For example, based on the curvature of a GaN/D wafer it may be advantageous to dispense the ceramic adhesive onto the diamond side of with GaN/D wafer while otherwise proceed according the flow chart illustrated in FIG. 3.

Figure 5:
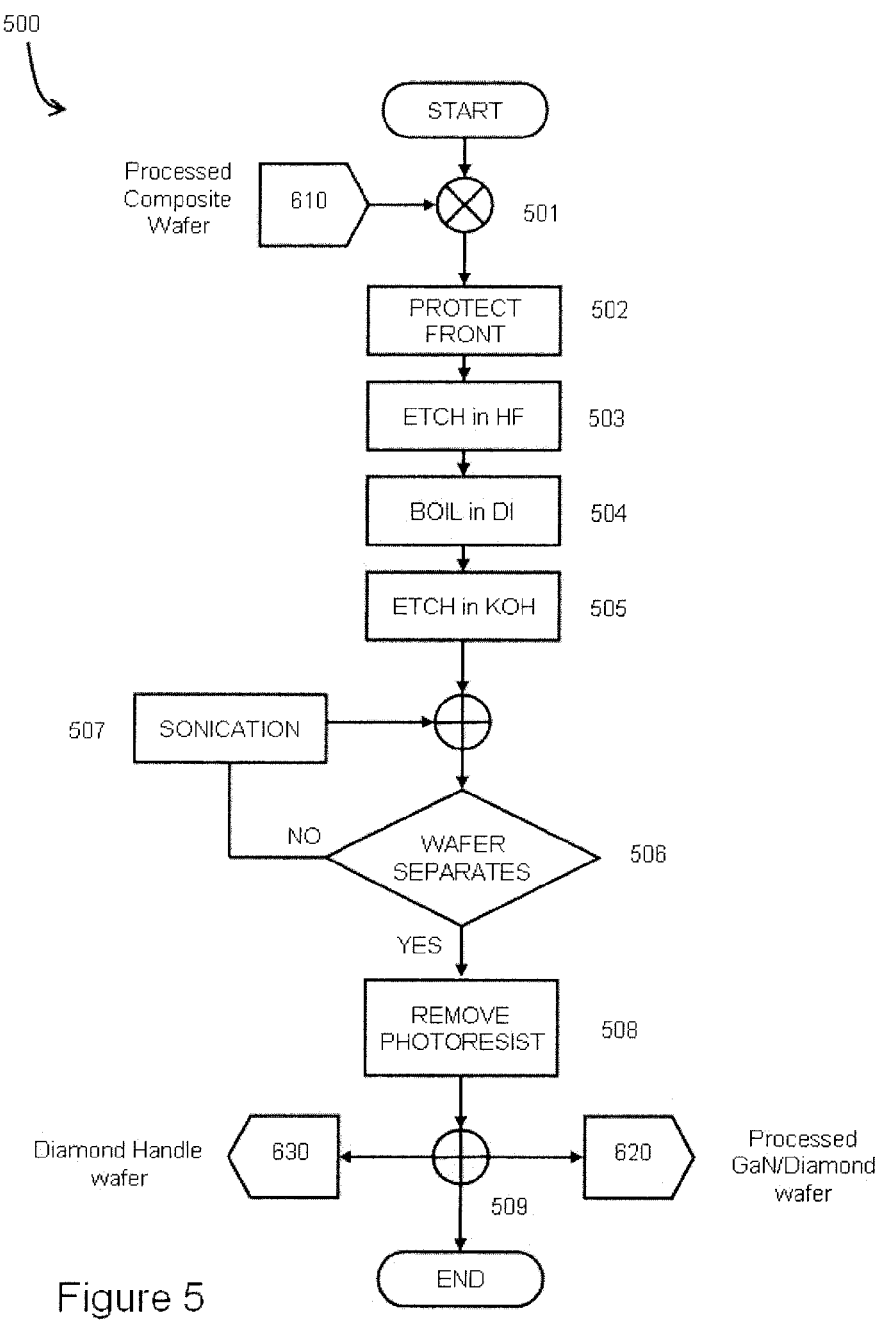
FIG. 5: Illustration of the method to dismount semiconductor-on-diamond wafers from diamond handle wafers and recycling of diamond handle wafers

A method 500 for releasing the semiconductor-on-diamond wafer from the DH wafer is illustrated with the help of FIG. 5.

Figure 6A:
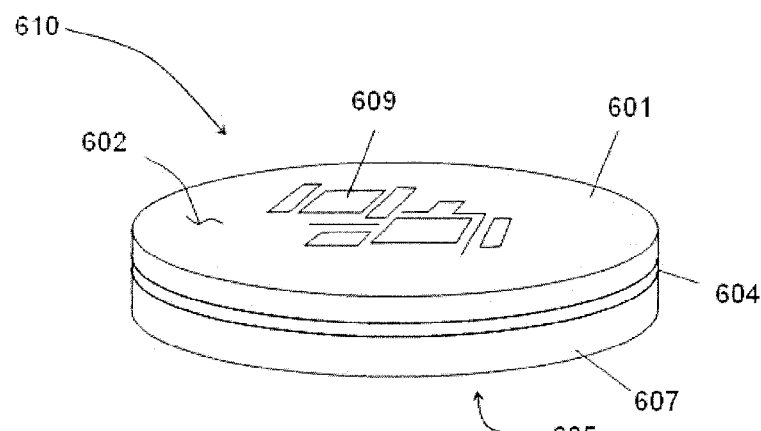
FIG. 6: Illustration of the processed composite wafer A) before and B) after separation

In Step 501, a composite wafer 610 is provided. This wafer has a semiconductor surface 602 (front) and DH surface 605 (back) as shown in FIG. 6A. The front surface 602 contains electronic or optoelectronic devices 609 disposed on it. These devices have been manufactured or are partly manufactured on the surface 602 while the semiconductor-on-wafer 601 has been attached to the DH 607 using the cement 604 between the two wafers.

In Step 502 the front surface 602 of the composite wafer 610 is protected by spinning photoresist on it so that all features 609 are covered in resist. Choose a resist and spinning speed to ensure the devices are fully protected. The selection of resist is not critical—a generic positive photoresist is sufficient. Pre-bake as specified for the specific resist. The resist must be able to withstand KOH at elevated temperatures for longer than the duration of the entire removal process. It is recommended that an extended bake be used. Alternatively the front side of the wafer can be covered in wax, and a handle wafer can be temporarily bonded to the front surface for additional protection. Using a cotton swab dipped in appropriate solvent, clean the edge interface between the GaN on diamond wafer and the DH wafer. Wick acetone into this opening using a cotton swab, and ensure that the resist still protects the devices. This interface must be very clean or the rest of the procedure may fail.

In Step 503, the coated composite wafer 610 is etched in 49% HF for 1 minute or until a white solution is observed leaching out from the edges between the wafers. This etching is halted by soaking the composite wafer in DI water for 1 minute and rinsing with flowing DI water for at least 30 seconds.

In Step 504, the composite wafer 610 is boiled in DI water for up to 30 minutes. The composite wafer 610 may separate into GaN/Diamond 601 and diamond-carrier 607 wafers.

In Step 505, the composite wafer 610 (or the separated wafers 601 and 607) are placed in concentrated hot KOH for 5 minutes. If it has not separated already, the composite wafer 610 should separate from the cement during this step.

If during Step 505, the composite wafer 610 separates, denoted by the test in Step 506, one may proceed to Step 508. If no separation is observed one proceeds with Step 507 where sonification is used to assist in the separation of the composite wafer 610. The sonification is performed while the wafer is in the KOH solution. The sonification schedule is one minute of sonication in solution every 5 minutes. Once the wafers have separated ("yes" in Step 506), one can either use a cotton swab to gently rub off the excess cement from the back of the wafer and carrier in KOH solution, or use sonication to do it. The cement will separate from the parts quickly. The KOH bath process is terminated using a rinse of all parts in DI water.

In Step 508, using an appropriate solvent, the protective photoresist is removed from the GaN on diamond wafer and the front surface is cleaned as necessary.

Figure 6B:
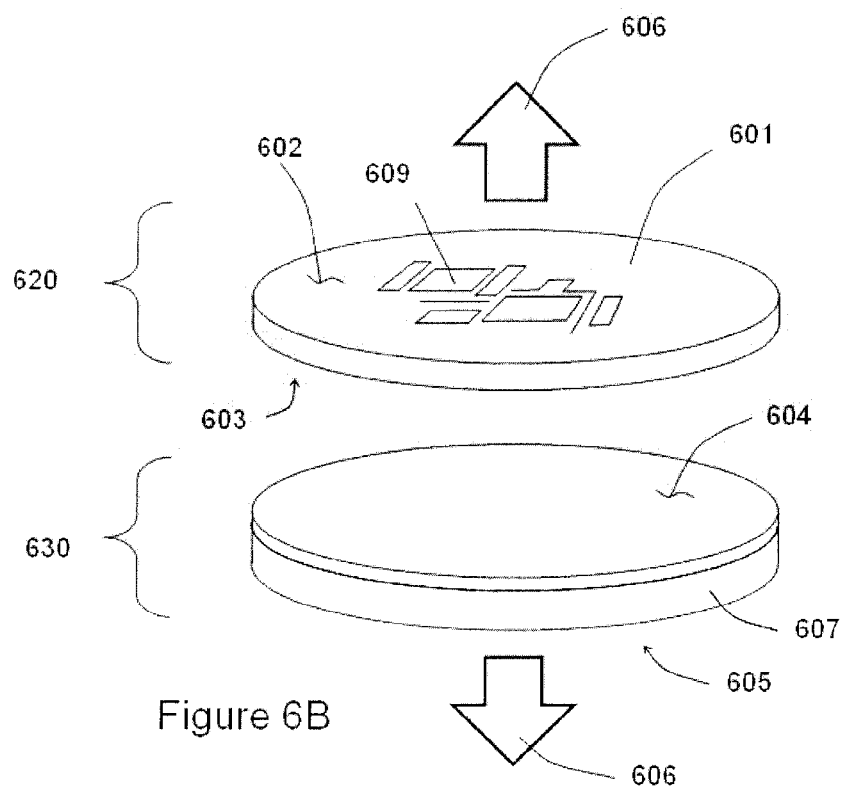

At the end of the process (Step 509), two wafers are produced as illustrated in FIG. 6B. A GaN/Diamond wafer 620 with now processed electronic or optoelectronic devices 609 on its top surface 602 and a DH wafer 630 which is now reused for similar mounting, i.e., provided again in Step 301 in FIG. 3.

It will be clear to a person skilled in the art that variation in the specific times and order of process steps may be employed to accomplish similar results as is disclosed above and that these variations do not depart from the spirit of the invention.

Figure 7:
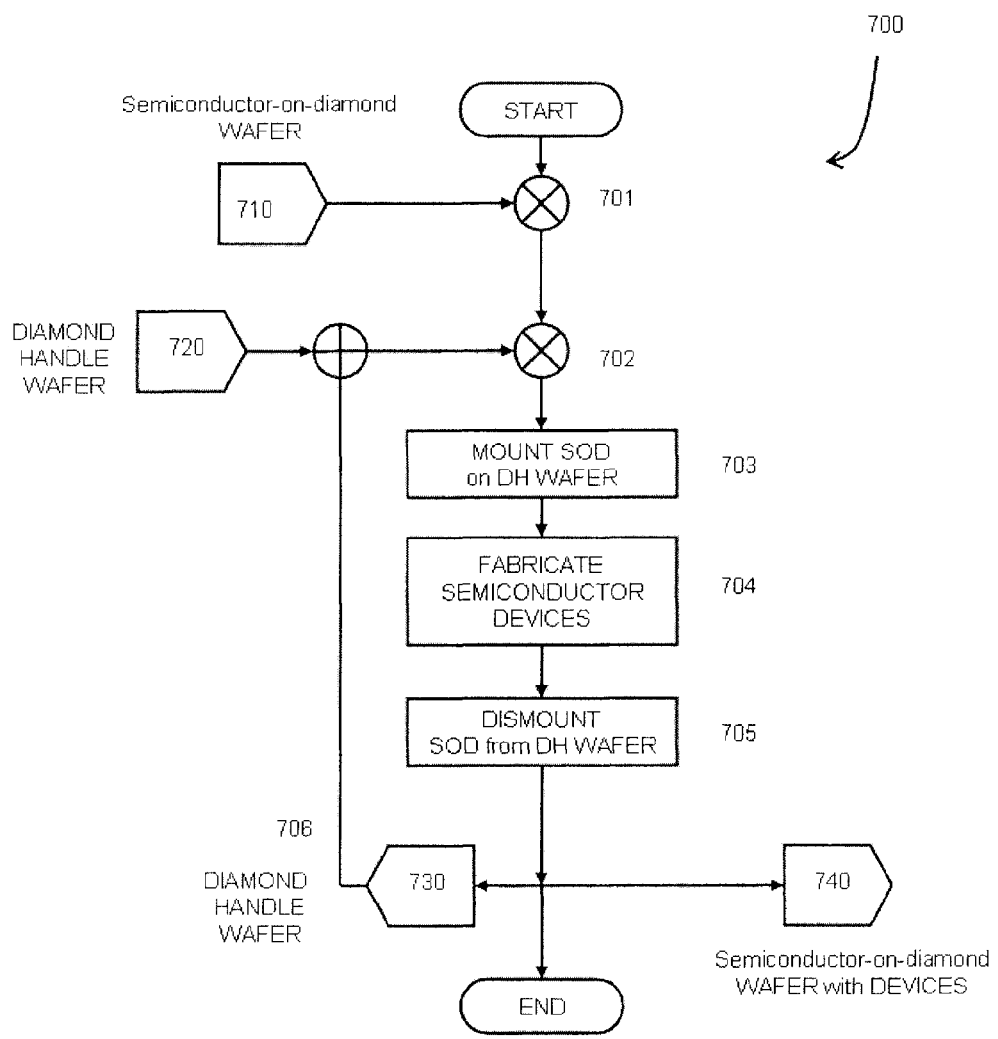
FIG. 7: Illustration of the method to process semiconductor-on-diamond wafers by mounting them onto a diamond handle wafer before processing and dismounting them after processing

The overall process 700 of using the disclosed mounting method and apparatus is described with the help of FIG. 7. In Step 701, a semiconductor-on-diamond wafer 710 on top of which one desires to fabricate semiconductor devices is provided. The wafer 710 is typically too thin to be processed free-standing or may have bow, tilt, or TTV that does not comply with the requirements for lithography during the semiconductor-device process. Such a wafer is mounted on a DH wafer according to the method described above (500). In Step 702, a DH wafer 720 is provided and in step 703 the semiconductor-on-diamond wafer is mounted on top of said DH wafer 720. Such a composite wafer will have mechanical rigidity and bow, tilt, and/or TTV satisfying standard semiconductor-device manufacturing process wafer requirements. In Step 704, the composite wafer is processed and electronic or optoelectronic devices are fabricated on its surface. The devices may be partly fabricated when the semiconductor-on-diamond wafer needs to be separated from the DH wafer in step 705. At this point semiconductor-on-diamond wafer 740 has electronic devices (or at least part of the electronic devices) manufactured on its surface and the wafer 740 is ready for further processing which may require free-standing semiconductor-on-diamond wafer. The wafer 740 may eventually be mounted onto a DH wafer again and the process 700 may be repeated with the same semiconductor-on-diamond wafer. The DH wafer 730 can be reused as is indicated with 706 in FIG. 7. In this way, an expensive substrate is not wasted, but its mechanical and thermal properties are used during the semiconductor-device processing.

The invention claimed is:

1. A composite wafer comprising:
   a semiconductor-on-diamond wafer comprising at least one layer of single-crystal semiconductor and at least one layer of diamond;
   a carrier plate that includes diamond material; and
   an adhesive disposed between said semiconductor-on-diamond wafer and said carrier plate;
   wherein said at least one layer of diamond is proximal to said carrier plate,
   wherein said carrier plate comprises a material having a coefficient of linear thermal expansion a at 20° C. in at least one plane of no more than $10.0 \times 10^{-6}$ K$^{-1}$,
   wherein said adhesive comprises a material having a melting point higher than 1000° C.,
   wherein said adhesive is capable of withstanding a temperature change of at least 900° C. in no more than 1.5 minutes while maintaining bonding between the semiconductor-on-diamond wafer and the carrier plate,
   wherein an exposed surface of single-crystal semiconductor has a surface flatness of lower than 30 μm over a total area of the exposed surface of single-crystal semiconductor,
   wherein the composite wafer has a bow of no more than 30 μm over the total area of the composite wafer,
   wherein the composite wafer has a thickness variation of no more than 30 μm over the total area of the composite wafer,
   wherein the composite wafer has a longest linear dimension of at least 120 mm, and
   wherein said at least one layer of single-crystal semiconductor comprises at least one semiconductor selected from the group containing gallium nitride, aluminum nitride, and indium nitride.

2. A composite wafer according to claim 1, wherein the coefficient of linear thermal expansion a at 20° C. of the material of said carrier plate is no more than $8.0 \times 10^{-6}$ K$^{-1}$.

3. A composite wafer according to claim 1, wherein said carrier plate is formed of a diamond composite material or a CVD diamond wafer.

4. A composite wafer according to claim 1, wherein said adhesive is porous.

5. A composite wafer according to claim 1, wherein said adhesive comprises a material having a coefficient of linear thermal expansion a at 20° C. in at least one plane of no more than 10.0×10-6 K-1.

6. A composite wafer according to claim 1, wherein the melting point of the material of said adhesive is at least 1400° C.

7. A composite wafer according to claim 1, wherein said adhesive is chemical resistant to one, more, or all of: HF; HCl; $H_2SO_4$; $HNO_3$; KOH; $H_2O_2$; Tetramethylammonium hydroxide (TMAH); Acetone; Isopropyl Alcohol (IPA); Methanol; Methylene Chloride; N-Methyl-2-pyrrolidone (NMP, 1165); Methyl Isobutyl Ketone (MIBK); and Methyl Ethyl Ketone (MEK).

8. A composite wafer according to claim 1, wherein said adhesive is a ceramic adhesive.

9. A composite wafer according to claim 8, wherein said ceramic adhesive comprises boron nitride.

10. A composite wafer according to claim 1, wherein the surface flatness of the exposed surface of single-crystal semiconductor is lower than 20 μm over a total area of the exposed surface of single-crystal semiconductor.

11. A composite wafer according to claim 1, wherein the bow of the composite wafer is no more than 20 μm over a total area of the composite wafer.

12. A composite wafer according to claim 1, wherein the thickness variation of the composite wafer is no more than 20 μm over the total area of the composite wafer.

13. A composite wafer according to claim 1, wherein the composite wafer has a tilt of no more than 30 μm over the total area of the composite wafer, wherein the tilt corresponds to a variation in edge height around the composite wafer when the composite wafer is laid on a flat surface.

14. A composite wafer according to claim 1, wherein said semiconductor-on-diamond wafer has thickness less than 200 μm and said flat carrier plate has a thickness larger than 400 μm.

15. A composite wafer according to claim 1, wherein the adhesive has a beveled edge.

16. A composite wafer according to claim 1, further comprising a sealant configured to seal areas on said composite wafer where said adhesive would otherwise be exposed.

* * * * *

UNITED STATES PATENT AND TRADEMARK OFFICE
CERTIFICATE OF CORRECTION

PATENT NO. : 9,882,007 B2  
APPLICATION NO. : 14/409867  
DATED : January 30, 2018  
INVENTOR(S) : Quentin Diduck et al.

Page 1 of 1

It is certified that error appears in the above-identified patent and that said Letters Patent is hereby corrected as shown below:

On the Title Page

Item (72) A co-inventor's name should be changed from Felix Ejeckham to Felix Ejeckam.

Signed and Sealed this  
Twenty-third Day of February, 2021

Drew Hirshfeld  
*Performing the Functions and Duties of the*  
*Under Secretary of Commerce for Intellectual Property and*  
*Director of the United States Patent and Trademark Office*